United States Patent
Mikes et al.

(10) Patent No.: US 10,432,209 B1
(45) Date of Patent: Oct. 1, 2019

(54) LINEAR FEEDBACK SHIFT REGISTER-BASED CLOCK SIGNAL GENERATOR, TIME DOMAIN-INTERLEAVED ANALOG TO DIGITAL CONVERTER AND METHODS

(71) Applicant: GLOBALFOUNDRIES INC., Grand Cayman (KY)

(72) Inventors: Steven E. Mikes, Apex, NC (US); Hayden C. Cranford, Jr., Cary, NC (US); John K. Koehler, Raleigh, NC (US); Steven J. Baumgartner, Zumbro Falls, MN (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/156,460

(22) Filed: Oct. 10, 2018

(51) Int. Cl.
    *H03M 1/10*     (2006.01)
    *H03M 1/12*     (2006.01)
    *H03K 23/54*     (2006.01)

(52) U.S. Cl.
    CPC .......... *H03M 1/1215* (2013.01); *H03K 23/54* (2013.01); *H03M 1/1245* (2013.01)

(58) Field of Classification Search
    CPC ............. H03M 1/1215; H03M 1/0624; H03M 1/1205; H03M 1/121; H03M 1/74; G06F 1/08; G06F 1/04; G06F 7/584; G06F 11/1068; G06F 13/3625; G06F 1/3237; G06F 2207/581; G06F 7/68; G06F 1/14; H03K 5/1565; H03K 21/10; H03K 3/84; H03K 5/135; H03K 23/54; H03K 5/05; H03K 5/00006; H03K 3/356078;
(Continued)

(56) References Cited

U.S. PATENT DOCUMENTS 6,040,725 A     3/2000   Lee et al.
6,242,953 B1 *   6/2001   Thomas .................... G06F 1/08
                                                                                                   327/115
(Continued)

OTHER PUBLICATIONS

Frans et al., "A 56Gb/s PAM4 Wireline Transceiver Using a 32-Way Time-Interleaved SAR ADC in 16nm FinFET," IEEE Symposium on VLSI Circuits, 2016, pp. 1-2.

*Primary Examiner* — Linh V Nguyen
(74) *Attorney, Agent, or Firm* — Gibb & Riley, LLC; David A. Cain, Esq.

(57) ABSTRACT

Disclosed is a linear feedback shift register (LFSR)-based clock signal generator that includes an LFSR, which outputs multi-bit states based on a system clock signal (CLK0). Based on the multi-bit states, a single-phase pulse generator generates first and second clock signals (CLK1 and CLK2), where the pulse rate of CLK1 is slower than that of the CLK0 and greater than that of CLK2. In some embodiments, a first multi-phase pulse generator can generate N-phases of the CLK1 based on CLK1 and N-phases of the CLK0 and a second multi-phase pulse generator can generate N-phases of CLK2 based on CLK2 and N-phases of CLK0. Furthermore, additional registers can optionally use the N-phases of CLK2 to further generate N sets of M-phases of the CLK2. Also disclosed are a multi-level circuit (e.g., a time domain-interleaved analog-to-digital converter (ADC)), which incorporates the LFSR-based clock signal generator, and associated methods.

19 Claims, 8 Drawing Sheets

(58) Field of Classification Search
CPC ....... H03K 3/356121; H03K 3/356139; H03K 3/86; H03K 5/133; H03K 5/159
USPC .......................................... 341/122–124, 155
See application file for complete search history.

(56) References Cited

U.S. PATENT DOCUMENTS

| | | | |
|---|---|---|---|
| 6,759,886 B2* | 7/2004 | Nakanishi | G06F 1/06 327/115 |
| 6,961,403 B1 | 11/2005 | Austin et al. | |
| 7,206,797 B2* | 4/2007 | Gressel | G06F 7/582 708/250 |
| 8,355,478 B1* | 1/2013 | Seefeldt | H03L 7/08 375/355 |
| 8,902,094 B1* | 12/2014 | Zhang | H03L 7/0814 341/122 |
| 9,503,115 B1* | 11/2016 | Shin | H03M 1/1215 |
| 9,584,144 B1 | 2/2017 | Zhou et al. | |
| 10,263,767 B1* | 4/2019 | Doi | G06F 7/00 |
| 2004/0049525 A1* | 3/2004 | Hars | G06F 7/584 708/250 |
| 2007/0079164 A1 | 4/2007 | Duvillard et al. | |
| 2011/0025390 A1* | 2/2011 | Yun | H03L 7/0814 327/159 |
| 2011/0204908 A1* | 8/2011 | Tada | G01R 31/318552 324/750.3 |
| 2013/0113572 A1* | 5/2013 | Sharda | G06F 1/04 331/34 |
| 2014/0203884 A1* | 7/2014 | Koniaris | H03K 3/64 331/177 R |
| 2016/0147505 A1* | 5/2016 | Lee | G06F 7/582 327/164 |
| 2019/0115908 A1* | 4/2019 | Prasad | H03K 23/54 |

* cited by examiner

LINEAR FEEDBACK SHIFT REGISTER-BASED CLOCK SIGNAL GENERATOR, TIME DOMAIN-INTERLEAVED ANALOG TO DIGITAL CONVERTER AND METHODS

BACKGROUND

Field of the Invention

The present invention relates to clock signal generators and, more particularly, to a clock signal generator suitable for relatively fast generation of different multi-phase clock signals, to a multi-level circuit (e.g., a time domain-interleaved analog-to-digital converter (ADC)) that employs the different multi-phase clock signals, and to associated methods.

Description of Related Art

Ultra-high speed analog-to-digital converter (ADC) designs typically use time domain interleaving as a means to increase throughput. As illustrated in FIG. 1, an exemplary time domain interleaved ADC can include a primary ADC 100 with a first circuit level 110 and a second circuit level 120. The first circuit level 110 can include an initial amplifier 105 connected to an input node 101. The initial amplifier 105 can receive an analog input signal from the input node 101 and can buffer that signal. The first circuit level 110 further includes multiple (N, e.g., 4) first circuit branches. Each first circuit branch can include a first sample and hold amplifier $115_0$-$115_{N-1}$, which is connected by a corresponding first sample and hold switch $111_0$-$111_{N-1}$ to the initial amplifier 105 and, thereby to the input node 101. The second circuit level 120 can include multiple multiplexers $150_0$-$150_{N-1}$ and multiple groups of multiple (M, e.g., 4) second circuit branches, which are connected between the first circuit branches and the multiplexers $150_0$-$150_{N-1}$, respectively. Each second circuit branch in a given group can be connected between a corresponding one of the multiplexers $150_0$-$150_{N-1}$ and a corresponding one of the first circuit branches and, more particularly, can include a sub-ADC $140_0$-$140_{M-1}$ connected to the corresponding one of the multiplexers $150_0$-$150_{N-1}$ and a second sample and hold switch $122_0$-$122_{M-1}$ that can selectively connect that sub-ADC to the first sample and hold amplifier of the corresponding one of the first circuit branches. The second circuit level 120 can further include digital signal processor 155 that receives intermediate digital output signals from the multiplexers $150_0$-$150_{N-1}$, respectively, and outputs a final digital output signal at an output node 102.

Time domain interleaving requires a clock signal generator (not shown) that can generate different, synchronized, multi-phase clock signals for controlling timing at the different circuit levels 110, 120, respectively, including multiple phases of a first clock signal for controlling the timing of the first circuit level components (including the first sample and hold switches $111_0$-$111_{N-1}$ and the sample and hold amplifiers $115_0$-$115_{N-1}$) and multiple phases of a second clock signal, which has a lower pulse rate and longer pulse width than the first clock signal, for controlling timing of the second circuit level components (including the second sample and hold switches $122_0$-$122_{M-1}$ and the sub-ADCs $140_0$-$140_{M-1}$). However, reliably generating these different, synchronized, multi-phase clock signals, particularly, for time domain-interleaved ADCs with a large total number of sub-ADCs (e.g., 16 or more) can be challenging. Furthermore, currently available clock signal generators configured to generate such clock signals require a complex clock distribution network, consume a significant amount of chip area and power, and are prone to timing glitches that require external intervention to fix.

SUMMARY

In view of the foregoing, disclosed herein are embodiments of a linear feedback shift register (LFSR)-based clock signal generator that can generate synchronized, multi-phase clock signals with different pulse rates. The LFSR-based clock signal generator can include an LFSR that receives a system clock signal and, in response, outputs a series of multi-bit states. The LFSR-based clock signal generator can further include a single-phase pulse generator that receives the multi-bit states and, in response, generates master timing pulses and, particularly, a first clock signal and a second clock signal that is different from the first clock signal. Specifically, the pulse rate of the first clock signal can be slower than the pulse rate of the system clock signal and the pulse rate of the second clock signal can be slower than the pulse rate of the first clock signal.

The LFSR-based clock signal generator can further include a pair of multi-phase pulse generators. Specifically, the LFSR-based clock signal generator can include a first multi-phase pulse generator, which receives the first clock signal and some predetermined number (N) of instances of the system clock signal in N different phases and, in response, generates N instances of the first clock signal in N different phases, respectively. The LFSR-based clock signal generator can also include a second multi-phase pulse generator, which receives the second clock signal and the N instances of the system clock signal in the N different phases and, in response, generates N instances of the second clock signal also in N different phases, respectively. Optionally, the LFSR-based clock signal generator can further include additional delay elements (e.g., additional registers). The additional delay elements can delay the N instances to generate N corresponding sets of some predetermined number (M) of additional instances of the second clock signal in M different phases, respectively.

The LFSR-based clock signal generator can further include an invalid state detection circuit that is operably connected to the LFSR and that can be used to automatically reset the LFSR when an all-zeros state is output by the LFSR and also when the LFSR has cycled through a predetermined number of states that is required in order to achieve the desired master timing pulses. Because of this automatic reset function, the clock signal generator is less prone to timing glitches that require external intervention to fix.

Also disclosed herein are embodiments of an on-chip time domain-interleaved analog-to-digital converter (ADC) that incorporates the above-described LFSR-based clock signal generator.

The time domain-interleaved ADC can include a first circuit level and a second circuit level. The first circuit level can include multiple first circuit branches and, particularly, a number (N) of first circuit branches. Each first circuit branch can include a first sample and hold amplifier and a first sample and hold switch that can selectively connect the first sample and hold amplifier to an input node. The second circuit level can include N multiplexers and N groups of second circuit branches connected between the N first circuit branches and the N multiplexers, respectively. Specifically, each group of second circuit branches can include a number (M) of second circuit branches connected between a corresponding one of the N multiplexers and a corresponding one of the N first circuit branches. Each second circuit branch in a given group can include a sub-ADC connected to the corresponding one of the multiplexers and a second sample and hold switch that can selectively connect the sub-ADC to the first sample and hold amplifier of the corresponding one of the first circuit branches. The second circuit level can further include a digital signal processor that receives intermediate digital output signals from the N multiplexers, respectively, and outputs a final digital output signal at an output node.

The time domain-interleaved ADC can further include a linear feedback shift register (LFSR)-based clock signal generator, as described in detail above. That is, the LFSR-based clock signal generator can include an LFSR that receives a system clock signal and, in response, outputs a series of multi-bit states. The LFSR-based clock signal generator can further include a single-phase pulse generator that receives the multi-bit states and, in response, generates master timing pulses and, particularly, a first clock signal and a second clock signal that is different from the first clock signal. Specifically, the pulse rate of the first clock signal can be slower than the pulse rate of the system clock signal and the pulse rate of the second clock signal can be slower than the pulse rate of the first clock signal. The LFSR-based clock signal generator can further include a first multi-phase pulse generator and a second multi-phase pulse generator. The first multi-phase pulse generator can receive the first clock signal and N instances of the system clock signal in N different phases and, in response, can generate multiple instances of the first clock signal in N different phases, respectively. The second multi-phase pulse generator can receive the second clock signal and the N instances of the system clock signal in the N different phases and, in response, can generate N instances of the second clock signal also in N different phases, respectively. Additional delay elements (e.g., additional registers) can delay the N instances of the second clock signal to generate N sets of M additional instances of the second clock signal in M different phases, respectively.

In such a time domain-interleaved ADC, the N instances of the first clock signal in the N different phases can control the timing of the various components in the first circuit level and, particularly, can control the timing of the first sample and hold switch and the sample and hold amplifier in each of the N first circuit branches, respectively. The M additional instances of the second clock signal in the M different phases in each of the N sets can control the timing of the various components in the second circuit level and, particularly, can control the timing of the second sample and hold switches and the sub-ADCs in the second circuit branches in each of the N groups of second circuit branches, respectively.

Also disclosed herein are method embodiments associated with the above-described circuit structures. Specifically, the method embodiments can include receiving, by a linear feedback shift register, a system clock signal and outputting, by the linear feedback shift register and based on the system clock signal, a series of multi-bit states. The method embodiments can further include receiving, by a single-phase pulse generator, the series of multi-bit states and generating, by the single-phase pulse generator and based on the series of multi-bit states, a first clock signal and a second clock signal that is different from the first clock signal. Specifically, the pulse rate of the first clock signal can be slower than the pulse rate of the system clock signal and the pulse rate of the second clock signal can be slower than a pulse rate of the first clock signal.

The method embodiments can further include receiving, by a first multi-phase pulse generator, the first clock signal and some predetermined number (N) of instances of the system clock signal in N different phases and generating, by the first multi-phase pulse generator and based on the received signals, N instances of the first clock signal in N different phases, respectively. The method embodiments can further include receiving, by a second multi-phase pulse generator, the second clock signal and the N instances of the system clock signal in the N different phases and generating, by the second multi-phase pulse generator and based on the received signals, N instances of the second clock signal also in N different phases, respectively. Optionally, the method embodiments can include using additional delay elements (e.g., additional registers) to delay the N instances of the second clock signal in order to generate N sets of some predetermined number (M) of additional instances of the second clock signal in M different phases.

The method embodiments can further use the various first and second clock signals generated by the LFSR-based clock signal generator to control the timing of different on-chip circuits or different circuit levels within the same on-chip multi-level circuit (e.g., within the first circuit level and the second circuit level, respectively, of a time domain-interleaved ADC).

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
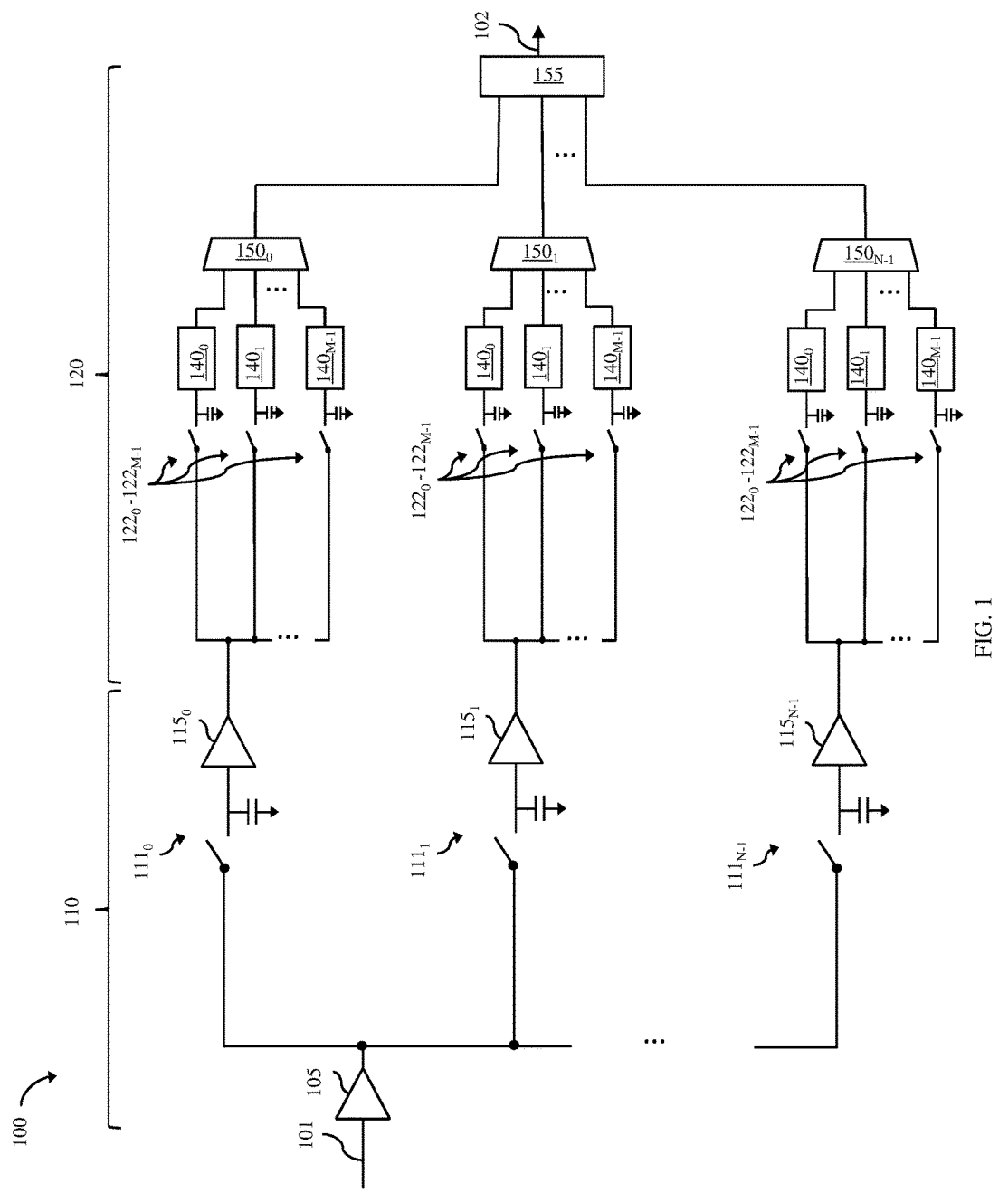
FIG. 1 is a schematic diagram illustrating an exemplary time interleaved analog-to-digital converter (ADC)

As mentioned above, ultra-high speed analog-to-digital converter (ADC) designs typically use time domain interleaving as a means to increase throughput. As illustrated in FIG. 1, an exemplary time domain interleaved ADC can include a primary ADC 100 with a first circuit level 110 and a second circuit level 120. The first circuit level 110 can include an initial amplifier 105 connected to an input node 101. The initial amplifier 105 can receive an analog input signal from the input node 101 and can buffer that signal. The first circuit level 110 further includes multiple (N, e.g., 4) first circuit branches. Each first circuit branch can include a first sample and hold amplifier $115_0$-$115_{N-1}$, which is connected by a corresponding first sample and hold switch $111_0$-$111_{N-1}$ to the initial amplifier 105 and, thereby to the input node 101. The second circuit level 120 can include multiple multiplexers $150_0$-$150_{N-1}$ and multiple groups of multiple (M, e.g., 4) second circuit branches, which are connected between the first circuit branches and the multiplexers $150_0$-$150_{N-1}$, respectively. Each second circuit branch in a given group can be connected between a corresponding one of the multiplexers $150_0$-$150_{N-1}$ and a corresponding one of the first circuit branches and, more particularly, can include a sub-ADC $140_0$-$140_{M-1}$ connected to the corresponding one of the multiplexers $150_0$-$150_{N-1}$ and a second sample and hold switch $122_0$-$122_{M-1}$ that can selectively connect that sub-ADC to the first sample and hold amplifier of the corresponding one of the first circuit branches. The second circuit level 120 can further include a digital signal processor 155 that receives intermediate digital output signals from the multiplexers $150_0$-$150_{N-1}$, respectively, and outputs a final digital output signal at an output node 102.

Time domain interleaving requires a clock signal generator (not shown) that can generate different, synchronized, multi-phase clock signals for controlling timing at the different circuit levels 110, 120, respectively, including multiple phases of a first clock signal for controlling the timing of the first circuit level components (including the first sample and hold switches $111_0$-$111_{N-1}$ and the sample and hold amplifiers $115_0$-$115_{N-1}$) and multiple phases of a second clock signal, which has a lower pulse rate and longer pulse width than the first clock signal, for controlling timing of the second circuit level components (including the second sample and hold switches $122_0$-$122_{M-1}$ and the sub-ADCs $140_0$-$140_{M-1}$). However, reliably generating the multiple phases of these different clock signals, particularly, in circuits that require a large number of sub-ADCs (e.g., 16 or more) can be challenging.

For example, generating multiple instances of the first clock signal in different phases and the multiple instances of the second clock signal in different phases, typically requires the processing of multiple instances of a system clock signal in different phases. For a 16-way time domain interleaved ADC (i.e., a time domain interleaved ADC with four first circuit branches each connected to a group of four second circuit branches such that there are a total of 16 sub-ADCs in the ADC), the first clock signal will be four times slower than the system clock signal, respectively (i.e., quarter-rate) and the second clock signal will be 16 times slower that the the system clock signal (i.e., 1/16-rate). However, different phases of a full-rate system clock signal are often not available and instead the timing circuit for the ADC receives multiple instances of a partial-rate system clock signal (e.g., a quarter-rate system clock signal) in different phases. In this case, the timing circuit must produce multiple instances of a 1/16-rate first clock signal in different phases and multiple instances of a 1/64-rate second clock signal in different phases. One straightforward method of achieving multiple instances of such very slow partial-rate clock signals in different phases is to employ unsynchronized clock dividers and then window them in order to create the required synchronized pulses. This ends up being very challenging to meet timing requirements due to the tight timing margins of cutting edge designs and the large amount of process variation in modern CMOS processes. Synchronized dividers prove to be too slow for operation at the required speed. Furthermore, currently available clock generators configured to generate such clock signals require a complex clock distribution network, consume a significant amount of chip area and power, and are prone to timing glitches that require external intervention to fix.

Figure 2:
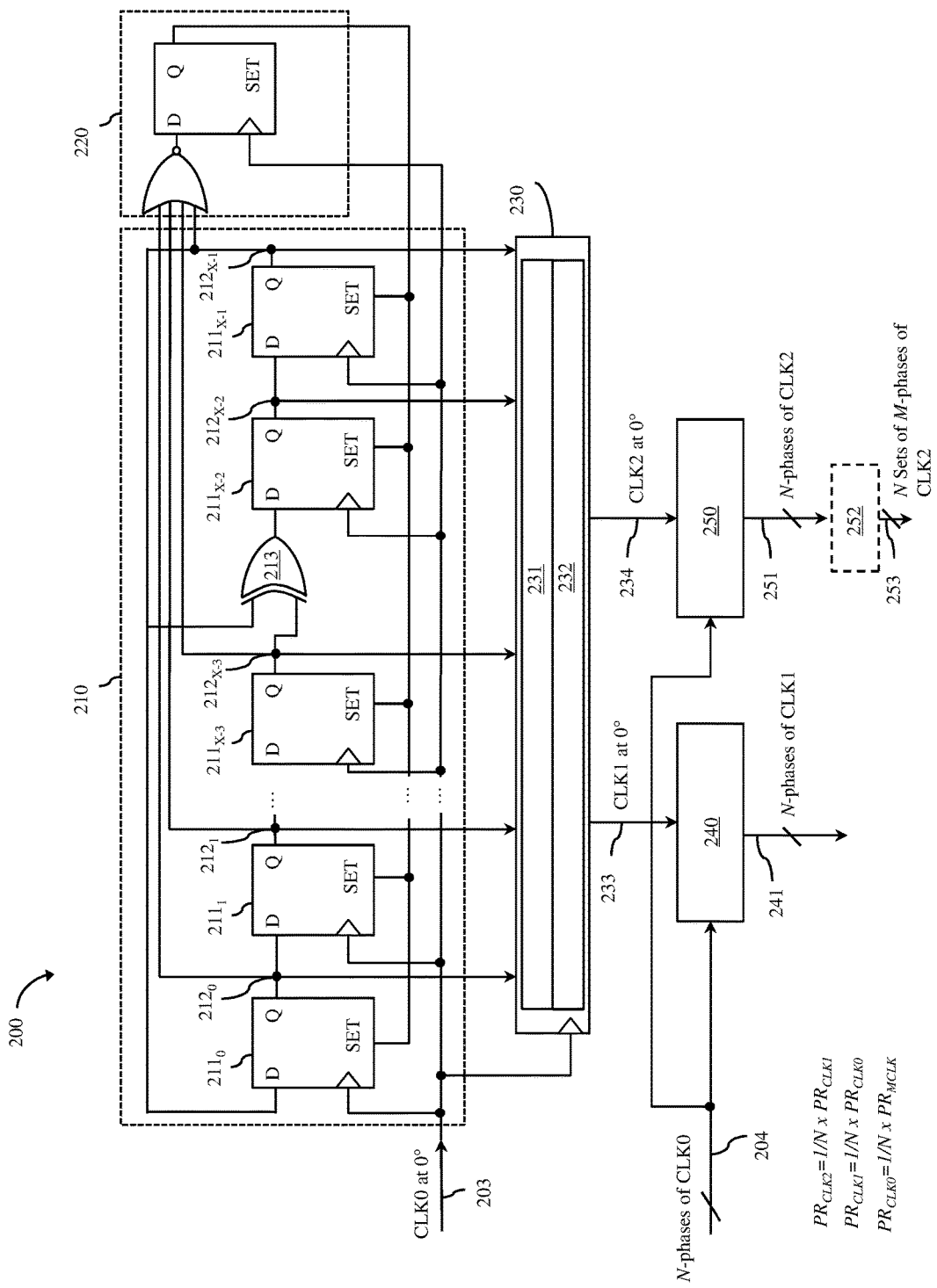
FIG. 2 is a schematic diagram illustrating disclosed embodiments of a linear feedback shift register (LFSR)-based clock signal generator.

In view of the foregoing, referring to FIG. 2, disclosed herein are embodiments of a linear feedback shift register (LFSR)-based clock signal generator 200 that can generate different, synchronized, multi-phase first and second clock signals and, particularly, can generate some predetermined number (N) of instances 241 of a first clock signal (CLK1) in N different phases (N-phases of CLK1) and the same number N of instances 251 of a second clock signal (CLK2) also in N different phases (N-phases of CLK2), where the first and second clock signals are synchronized, where the pulse rate of the first clock signal ($PR_{CLK1}$) is 1/N times the pulse rate ($PR_{CLK0}$) of a system clock signal (CLK0) and where the pulse rate of the second clock signal ($PR_{CLK2}$) is 1/N times the pulse rate of the first clock signal ($PR_{CLK1}$). Optionally, the LFSR-based clock signal generator 200 can further generate N sets 253 of some number (M) of additional instances of the second clock signal in M different phases for each of the N instances 251. It should be noted that, optionally, the pulse rate of the system clock signal ($PR_{CLK0}$) can be 1/N times the pulse rate of a master system clock signal ($PR_{MCLK}$).

Specifically, the LFSR-based clock signal generator 200 can include at least an LFSR 210, an invalid state detection circuit 220 operably connected to the LFSR 210, and a single-phase clock signal generator 230.

The LFSR 210 can include some predetermined number (X) of flip-flops $211_0$-$211_{X-1}$ connected in a chain such that the output bit from the first flip-flop $211_0$ in the chain is the input bit for the next flip-flop $211_1$ in the chain and so on. An XOR gate 213 can further be inserted into the chain between the third and second to last flip-flops $211_{X-3}$ and $211_{X-2}$. Additionally, taps $212_0$-$212_{X-1}$ can be located at the outputs of the flip-flop $211_0$-$211_{X-1}$, respectively. In operation, the LFSR 210 receives a single-phase system clock signal 203 (CLK0 at 0°) from a system clock signal generator (not shown) as the input to the first flip-flop $211_0$ in the chain and outputs a series of multi-bit states, where each multi-bit state includes the individual output bits from each of the flip-flops $211_0$-$211_{X-1}$ at each of the taps $212_0$-$212_{X-1}$, respectively. Those skilled in the art will recognize that such an LFSR 210 can produce a predetermined number (Y) of multi-bit states, where the value of Y is determined by solving the following equation:

$$Y=2^X-1, \qquad (1)$$

where, as mentioned above, X is the number of flip-flops $211_0$-$211_{X-1}$ in the chain. By generating a series of multi-bit states, the LFSR 210 can effectively function as a counter with the clocked output of the multi-bit states functioning as a count from the counter (i.e., 1, 2, . . . Y).

The single-phase pulse generator 230 can use a count provided by such an LFSR 210 to generate first and second master timing pulses 233 and 234, as discussed in greater detail below. However, to ensure that the count provided by the LFSR 210 to the single-phase pulse generator 230 produces the desired first and second master timing pulses 233 and 234, invalid state detection circuit 220 can be operably connected to the LFSR 210 and can be programmed to detect when any invalid states that lead to an improper count have been reached by the LFSR 210 and, in response, can cause the LFSR 210 to reset the count. Specifically, an all-zeros state output by an LFSR 210 functioning as a counter will be considered an invalid state because every shift of a zeroed LFSR will lead to a zero. Additionally, while an LFSR 210 functioning as a counter may be able to produce a total of Y multi-bit states (i.e., a Y-count), generation of the first and second master timing pulses 233 and 234 by the single-phase pulse generator 230 of the LFSR-based clock signal generator 200 may, as discussed in greater detail below, require a different number (Z) of multi-bit states (i.e., a Z-count) and only that Z-count. In this case, all multi-bit states above the Z-count would also be considered invalid. Thus, the invalid state detection circuit 220 can be programmed to detect when the LFSR 210 has cycled through Z multi-bit states and also when an all-zeros state has been reached. Furthermore, the invalid state detection circuit 220 can cause the LFSR 210 to reset when either condition is detected (i.e., when the LFSR 210 has cycled through Z multi-bit states or when the LFSR 210 has reached the all-zeros state).

Thus, the LFSR 210 will output only a series of Z valid multi-bit states (i.e., a Z-count) to the single-phase pulse generator 230 for use in generating the first and second master timing pulses 233 and 234.

Specifically, the single-phase pulse generator 230 can include pipeline registers 231 that receive and buffer the Z multi-bit states (i.e., that receive and buffer the output bits from the taps $212_0$-$212_{X-1}$, respectively). The Z multi-bit states, which have been buffered (i.e., the Z buffered multi-bit states), can then be fed into combinational logic 232 and the combinational logic 232 can use the clocked receipt these multi-bit states to produce the first and second master timing pulses 233 and 234 and, particularly, a single-phase first clock signal 233 (CLK1 at 0°) and a single-phase second clock signal 234 (CLK2 at 0°), each with a desired sequence of pulses. The single-phase first clock signal 233 (CLK1 at 0°) can be synchronized with the single-phase system clock signal 203 (CLK0 at 0°) and can have a pulse rate ($PR_{CLK1}$) that is slower than and, particularly, 1/Nth (e.g., ¼th) the pulse rate ($PR_{CLK0}$) of the system clock signal (CLK0). The single-phase second clock signal 234 (CLK2 at 0°) can be synchronized with the single-phase first clock signal 233 (CLK1 at 0°) and can have a pulse rate ($PR_{CLK2}$) that is slower than and, particularly, 1/Nth (e.g., ¼th) the pulse rate ($PR_{CLK1}$) of first clock signal (CLK1).

Figure 3:
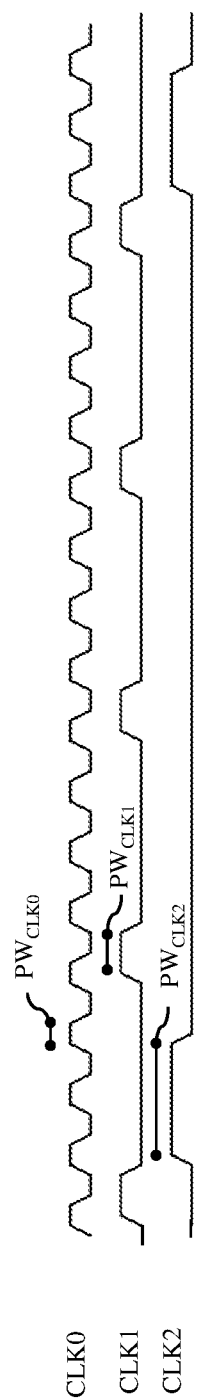
FIG. 3 is a timing diagram illustrating exemplary master timing pulses (CLK1 and CLK2) that can be generated by the LFSR-based clock signal generator of FIG. 2.

For example, as illustrated in FIG. 3, in one exemplary embodiment, the pulse rate ($PR_{CLK0}$) of the system clock signal (CLK0) can be ¼th the pulse rate ($PR_{MCLK}$) of a master system clock signal (CLKM). That is, the system clock signal (CLK0) can be a ¼$^{th}$-rate clock signal (C4). Furthermore, N can be equal to four. In this case, the pulse rate ($PR_{CLK1}$) of CLK1 can be ¼$^{th}$ the pulse rate ($PR_{CLK0}$) of CLK0 such that CLK1 is ¹⁄₁₆$^{th}$-rate clock signal (C16). Additionally, the pulse rate ($PR_{CLK2}$) of CLK2 can be ¼th the pulse rate ($PR_{CLK1}$) of CLK1 such that CLK2 is a ¹⁄₆₄$^{th}$-rate clock signal (C64).

It should be noted that in this exemplary embodiment, where the CLK0 is a ¼$^{th}$-rate clock signal (C4) and N is equal to four, the count output by the LFSR 210 would need to be a 16-count in order to generate a ¹⁄₁₆$^{th}$-rate CLK1 and a ¹⁄₆₄$^{th}$-rate CLK2. If Z=16, then equation (1) above dictates that the number of flip-flops $211_0$-$211_{X-1}$ in the chain of the LFSR 210 must be at least 5 (i.e., X≥5). Specifically, 4 flip-flops would be too few because 4 flip-flops could only result in a total number of 15 four-bit states (i.e., $Y=2^4-1=16-1=15$) or a 15-count. Five flip-flops would, however, result in too many multi-bit states and, more particularly, 31 five-bit states (i.e., $Y=2^5-1=32-1=31$) or a 31-count. Since only 16 multi-bit states (i.e., a 16-count) are required for generation of the master timing pulses 233 and 234, all states above the 16-count will be considered invalid. In this case, the invalid state detection circuit 220 would be programmed to detect when the LFSR 210 has reached an all-zeros state and also when the LFSR 210 has cycled through 16 multi-bit states and to reset the LFSR 210 when either condition is detected.

It should be noted that, also as illustrated in FIG. 3, in addition to having different pulse rates the above-described first and second master timing pulses 233 and 234 can be generated so as to have different pulse widths. That is, the CLK1 can have a pulse width ($PW_{CLK1}$) that is longer than the pulse width ($PW_{CLK0}$) of CLK0 and the CLK2 can have a pulse width ($PW_{CLK2}$) that is longer than the pulse width ($PR_{CLK1}$) of the CLK1.

Some on-chip circuits may only require two different clock signals (e.g., CLK1 at 0° and (CLK2 at 0°) for timing control. In this case, the LFSR-based clock signal generator 200 would need no additional circuitry. Other on-chip circuits may require additional clock signals for timing control. For example, other on-chip circuits may require one or more additional instances of only one or both of these different clock signals in one or more different phases without synchronization. In this case, one or more independent multi-phase pulse generators (not shown) could be incorporated into the LFSR-based clock signal generator 200. Still other on-chip circuits may require multiple instances of each of these two different clock signals (CLK1 and CLK2) in different phases and also synchronized. In this case, the LFSR-based clock signal generator 200 can, as illustrated, further include a pair of multi-phase pulse generators, including a first multi-phase pulse generator 240 and a second multi-phase pulse generator 250, which are controlled by the same multi-phase system clock signal (N-phases of CLK0) to ensure synchronization. The first multi-phase pulse generator 240 and the second multi-phase pulse generator 250 can each be N-phase pulse generators. That is, they can each be adapted to generate N different phases of received clock signal.

Figure 4A:
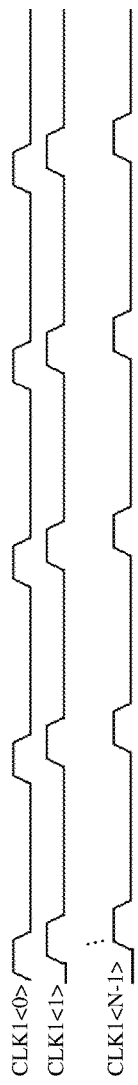
FIG. 4A is a timing diagram illustrating exemplary N-phases of CLK1 that can also be generated by the LFSR-based clock signal generator of FIG. 2.

Specifically, the first multi-phase pulse generator 240 can receive the single-phase first clock signal 233 (i.e., CLK1 at 0°) and also some predetermined number (N) of instances 204 of the system clock signal in N different phases, respectively (N-phases of CLK0) (e.g., from the system clock signal generator (not shown)). In response, the first multi-phase pulse generator 240 can generate multiple instances and, particularly, N instances 241 of the first clock signal in N different phases, respectively (N-phases of CLK1, also referred to as CLK1<N-1:0>) including CLK1<0>, CLK1<1>, and so on until CLK1<N-1>, as shown in FIG. 4A.

Figure 4B:
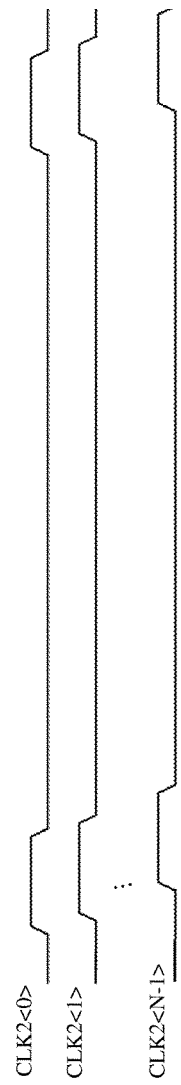
FIG. 4B is a timing diagram illustrating exemplary N-phases of CLK2 that can also be generated by the LFSR-based clock signal generator of FIG. 2.

Additionally, the second multi-phase pulse generator 250 can receive the single-phase second clock signal 234 (i.e., CLK2 at 0°) and also the N instances 204 of the system clock signal in N different phases (N-phases of CLK0) (e.g., again from the system clock signal generator (not shown)). In response, the second multi-phase pulse generator 250 can generate multiple instances and, particularly, N instances 251 of the second clock signal in N different phases, respectively (N-phases of CLK2, also referred to as CLK2<N-1:0) including CLK1<0>, CLK2<1>, and so on until CLK2<N-1>, as shown in FIG. 4B.

The N instances 241 of the first clock signal (CLK1) from the first N-phase pulse generator 240 and the N instances 251 of the second clock signal (CLK2) from the second N-phase pulse generator 250 can be used to control different on-chip circuits, respectively, or different levels, respectively, of the same on-chip circuit. Typically, however, different on-chip circuits or different levels of the same on-chip circuit that use different clock signals will not require the same number of different phases of those clock signals. Therefore, as mentioned above, the disclosed LFSR-based clock signal generator 200 can further, optionally, include additional delay elements 252 (e.g., additional registers) to selectively adjust the total number of instances of the second clock signal (CLK2) output by the LFSR-based clock signal generator 200.

Figure 4C:
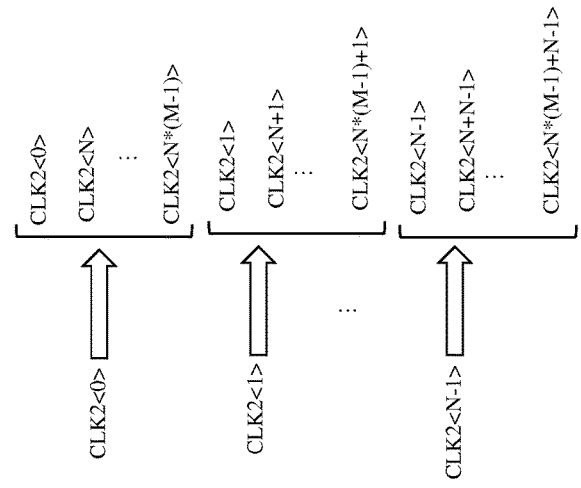
FIG. 4C is a diagram further illustrating N sets of M additional instances CLK2 that can also be generated by the LFSR-based clock signal generator of FIG. 2.

Specifically, the additional delay elements 252 (e.g., the additional registers) can receive the N instances 251 of the second clock signal (CLK2) from the second N-phase pulse generator 250 and can delay those N instances 251, as necessary, in order to generate N sets 253 of some predetermined number (M) of additional instances of the second clock signal (CLK2) in M different phases (i.e., CLK2<N*(M−1)+N−1:0>). That is, for each instance 251 of the second clock signal output by the second multi-phase pulse generator 250, the additional delay elements 252 can output a different set 253 of M additional instances of the second clock signal (CLK2) in M different phases, respectively. As illustrated in FIG. 4C, the N sets 253 will include: $Set_0$ with CLK2<0>, CLK2<N>, . . . and CLK2<N*(M−1)>; $Set_1$ with CLK2<1>, CLK2<N+1>, . . . and CLK2<N*(M−1)+1>; . . . and $Set_{N-1}$ with CLK2<N−1>, CLK2<N+N−1>, . . . and CLK2<N*(M−1)+N−1>. Since M is the total number of instances of the second clock signal to be generated in each of the N sets, N*M will be the total number of instances of the second clock signal generated and output by the LFSR-based clock signal generator 200.

Thus, for example, in an exemplary embodiment where N is equal to four and where M is also equal to four, the second multi-phase pulse generator 250 will generate four instances 251 of the second clock signal (including CLK2<0>, CLK2<1>, CLK2<3>, and CLK2<4>) and the additional delay elements 252 will further generate and output four sets 253 of four additional instances of the second clock signal including: $Set_0$ with CLK2<0>, CLK2<4>, CLK2<8>, and CLK2<12>; $Set_1$ with CLK2<1>, CLK2<5>, CLK2<9>, and CLK2<13>; $Set_2$ with CLK2<2>, CLK2<6>, CLK2<10>, CLK2<14>; and $Set_3$ with CLK2<3>, CLK2<7>, CLK2<11>, and CLK2<15>. Thus, the LFSR-based clock signal generator 200 will output a total of sixteen additional instances of the second clock signal.

It should be noted that because of the automatic reset function provided by the invalid detection circuit 220, the above-described LFSR-based clock signal generator 200 is less prone to timing glitches that require external intervention to fix. Additionally, it should be noted that power consumption by such an LFSR-based clock signal generator 200 is significantly reduced as compared to currently available clock signal generators that preform a similar function (e.g., from approximately 80 mA to approximately 56 mA).

The first and second clock signals described above and output by the above-described LFSR-based clock signal generator 200 can be used, for example, to control timing of different on-chip circuits. Alternatively, the first and second clock signals described above and output by this LFSR-based clock signal generator 200 can be used to control timing of different circuit levels within the same on-chip multi-level circuit.

Figure 5A:
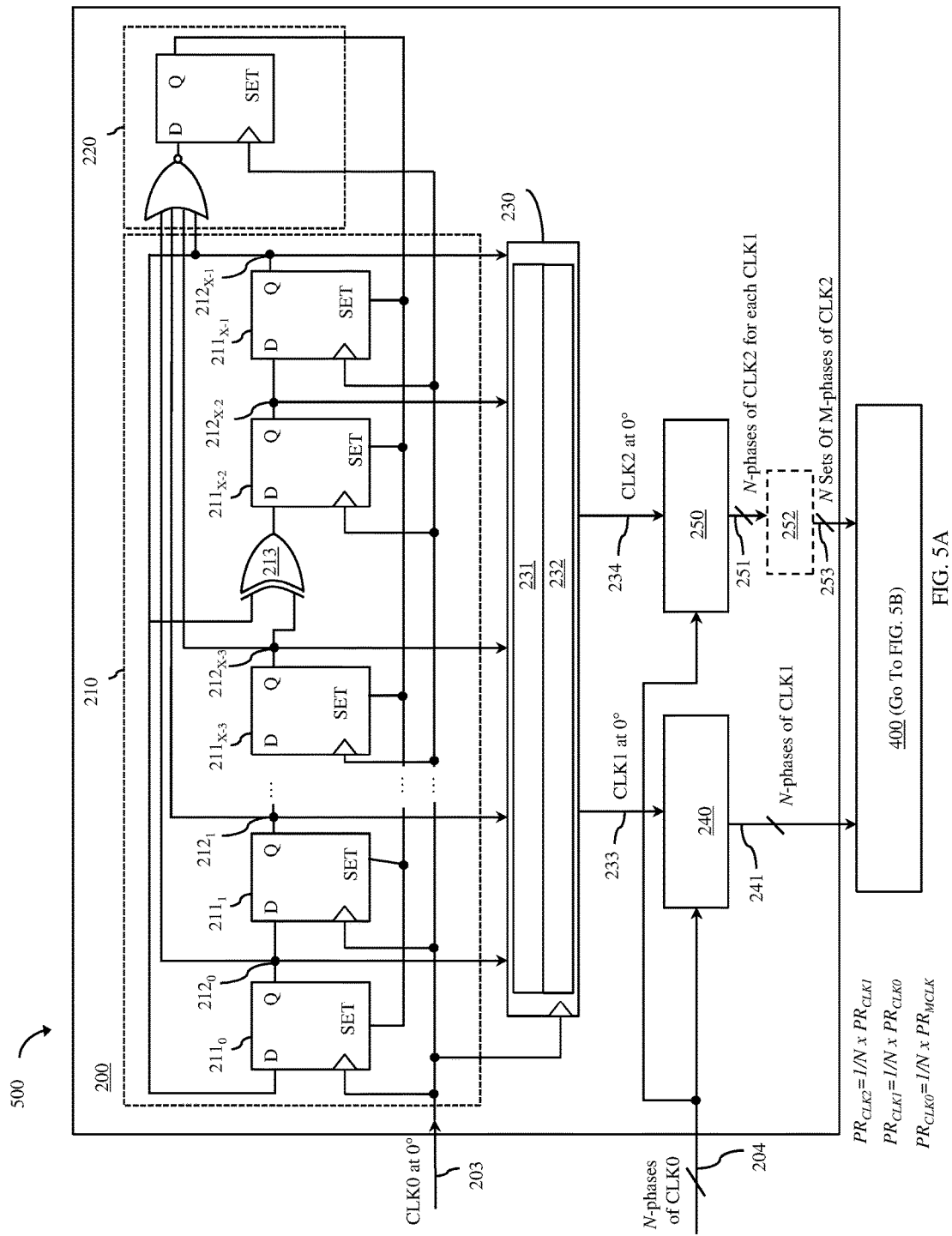
FIGS. 5A-5B show a schematic diagram illustrating embodiments of a time domain-interleaved ADC that incorporates the LFSR-based clock signal generator of FIG. 2.
Figure 5B:
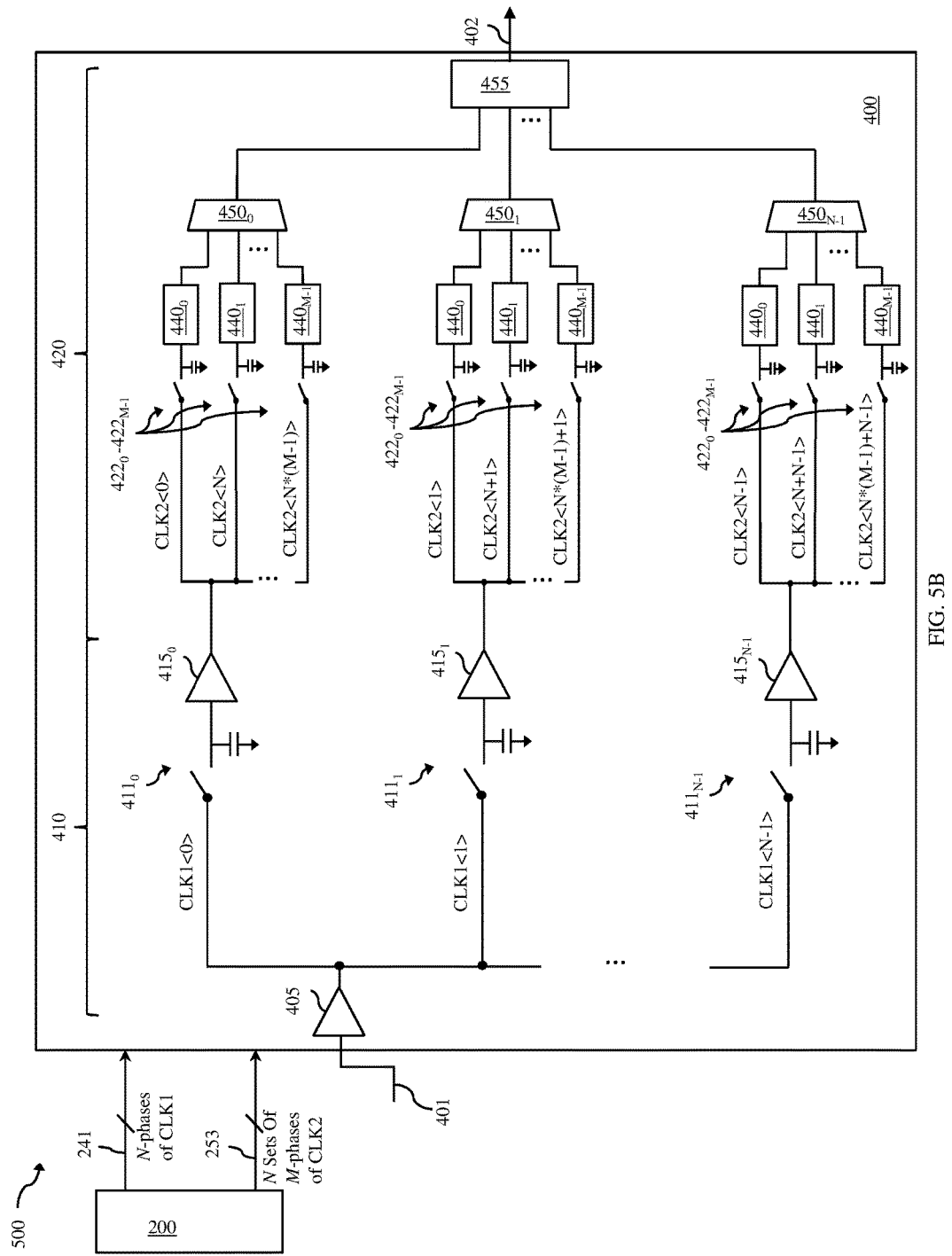

For example, referring to FIGS. 5A-5B, also disclosed herein are embodiments of an on-chip multi-level circuit and, particularly, a time domain-interleaved analog-to-digital converter (ADC) 500. This time domain-interleaved ADC 500 can include a primary analog-to-digital converter (ADC) 400 and a linear feedback shift register (LFSR)-based clock signal generator 200, as described above, operably connected to the primary ADC 400.

The primary ADC 400 can, for example, be essentially the same as that described above and illustrated in FIG. 1. That is, the primary ADC 400 can include a first circuit level 410 and a second circuit level 420.

The first circuit level 410 can include an initial amplifier 405 connected to an input node 401. The initial amplifier 405 can receive an analog input signal from the input node 401 and can buffer that signal. The first circuit level 410 can further include multiple (N) first circuit branches. Each first circuit branch can include a first sample and hold amplifier $415_0$-$415_{N-1}$, which is connected by a corresponding first sample and hold switch $411_0$-$411_{N-1}$ to the initial amplifier 405 and, thereby to the input node 401.

The second circuit level 420 can include multiple multiplexers $450_0$-$450_{N-1}$ and groups of multiple (M) second circuit branches, which are connected between the first circuit branches and the multiplexers $450_0$-$450_{N-1}$, respectively. Each second circuit branch in a given group can be connected between a corresponding one of the multiplexers $450_0$-$450_{N-1}$ and a corresponding one of the first circuit branches and, more particularly, can include a sub-ADC $440_0$-$440_{M-1}$ (also referred to herein as an ADC slice) connected to the corresponding one of the multiplexers $450_0$-$450_{N-1}$ and a second sample and hold switch $422_0$-$422_{M-1}$ that can selectively connect that sub-ADC to the first sample and hold amplifier of the corresponding one of the first circuit branches. The second circuit level 420 can further include a digital signal processor 455 that receives intermediate digital output signals from the multiplexers $450_0$-$450_{N-1}$, respectively, and outputs a final digital output signal at an output node 402.

The LFSR-based clock signal generator 200 can be operably connected to the primary ADC 400 and, more particularly, a clock signal distribution network can apply the different multi-phase clock signals generated by the LFSR-based clock signal generator 200 to the various components of the primary ADC 400 in order to control timing at the different circuit levels 410, 420.

As discussed in detail above, the LFSR-based clock signal generator 200 can include a first multi-phase pulse generator 240 that generates and outputs some predetermined number (N) of instances 241 of a first clock signal (CLK1). As illustrated in FIG. 3, the first clock signal (CLK1) can have a pulse rate ($PR_{CLK1}$) that is slower than and, particularly, 1/Nth (e.g., ¼th) the pulse rate ($PR_{CLK0}$) of a system clock signal 203, which may, optionally, be slower than and, particularly, 1/Nth (e.g., ¼th) the pulse rate ($PR_{MCLK}$) of a master system clock signal (MCLK). The first clock signal (CLK1) can also have a pulse width ($PW_{CLK1}$) that is longer than the pulse width ($PW_{CLK0}$) of the system clock signal (CLK0). Additionally, the N instances 241 of the first clock signal (CLK1) can be generated in N different phases, respectively (e.g., N-phases of CLK1 (CLK1<N−1:0>)), see FIG. 4A. They can further be distributed so as to control the different first circuit branches in the first circuit level 410 of the primary ADC 400, see FIG. 5B. That is, the N instances 241 of the first clock signal (CLK1) can include: CLK1<0>, CLK1<1>, and so on through CLK1<N−1>, where N is the total number of instances of the first clock signal (CLK1)

generated and where N is also equal to the total number of first circuit branches. CLK1<0> can be distributed so as to control timing of the first sample and hold switch $411_0$ and the sample and hold amplifier $415_0$ in one first circuit branch; CLK1<1> can be distributed so as to control timing of the first sample and hold switch $411_1$ and the sample and hold amplifier $415_1$ in the next first circuit branch; and so on with CLK1<N−1> being distributed so as to control timing of the first sample and hold switch $411_{N-1}$ and the sample and hold amplifier $415_{N-1}$ in the Nth first circuit branch.

The LFSR-based clock signal generator 200 can further include a second multi-phase pulse generator 250 that generates and outputs the same predetermined number (N) of instances 251 of a second clock signal (CLK2) that is different from the first clock signal (CLK1). That is, as illustrated in FIG. 3, the second clock signal (CLK2) can have a pulse rate ($PR_{CLK2}$) that is slower than and, particularly, 1/Nth (e.g., ¼th) the pulse rate ($PR_{CLK1}$) of first clock signal (CLK1). The second clock signal (CLK2) can also have a pulse width ($PW_{CLK2}$) that is longer than the pulse width ($PW_{CLK1}$) of the first clock signal (CLK1). Additionally, like the multiple instances 241 of the first clock signal (CLK1), the N instances 251 of the second clock signal (CLK2) can be generated in N different phases, respectively (e.g., N-phases of CLK2 (CLK2<N−1:0>), see FIG. 4B.

The LFSR-based clock signal generator 200 can further include additional delay elements 252 (e.g., additional registers) to generate and output N sets 253 of additional instances of the second clock signal in a number (M) of different phases, where each of the N sets 253 is generated using a corresponding one of the N instances 251 of the second clock signal output by the second multi-phase pulse generator 250. That is, the additional delay elements generate M-phases of CLK2 for each of the N-phases of the second clock signal output by the second multi-phase pulse generator 250 (CLK2<N*(M−1)+N−1:0>)), see FIG. 4C. Each set 253 of M instances of the second clock signal can be distributed so as to control a different group of second circuit branches in the second circuit level 420 of the primary ADC 400, see FIG. 5B.

For example, if the first circuit level 410 includes N first circuit branches and the second circuit level 420 includes M second circuit branches connected to each one of the first circuit branches, then the total number of second circuit branches (and, thereby, the total number sub-ADCs 440 within the second circuit level 420) will be equal to N*M. As illustrated in FIG. 5B, to operate such an ADC 500, the N instances 241 of the first clock signal can be distributed to control timing in the first circuit level 410 as follows: CLK1<0> can be distributed to control timing of the first sample and hold switch $411_0$ and the sample and hold amplifier $415_0$ in the one of the first circuit branches; CLK1<1> can be distributed to control timing of the first sample and hold switch $411_1$ and the sample and hold amplifier $415_1$ in the next first circuit branch; and so on with CLK1<N−1> being distributed to control timing of the first sample and hold switch $411_{N-1}$ and the sample and hold amplifier $415_{N-1}$ in the last first circuit branch. Additionally, the N*M instances of the second clock signal can be distributed to control timing in the second circuit level 420 as follows: CLK2<0>, CLK2<N>, . . . and CLK2<N*(M−1)> can be distributed so as to control timing of the second sample and hold switches $422_{0-(M-1)}$ and the sub-ADC $440_{0-(M-1)}$ in the second circuit branches within the group connected to the sample and hold amplifier $415_0$ of the first circuit branch clocked by CLK1<0>; CLK2<1>, CLK2<N+1>, . . . and CLK2<N(M−1)+1> can be distributed so as to control timing of the second sample and hold switches $422_{0-(M-1)}$ and the sub-ADCs $440_{0-(M-1)}$ in the second circuit branches within the group connected to the sample and hold amplifier $415_1$ of the first circuit branch clocked by CLK1<1>; . . . and CLK2<N−2>, CLK2<N+N−2>, . . . and CLK2<N*(M−1)+N−1> can be distributed so as to control timing of the second sample and hold switches $422_{0-(M-1)}$ and the sub-ADCs $440_{0-(M-1)}$ in the second circuit branches within the group connected to the sample and hold amplifier $415_{N-1}$ of the first circuit branch clocked by CLK1<N−1>.

Figure 6:
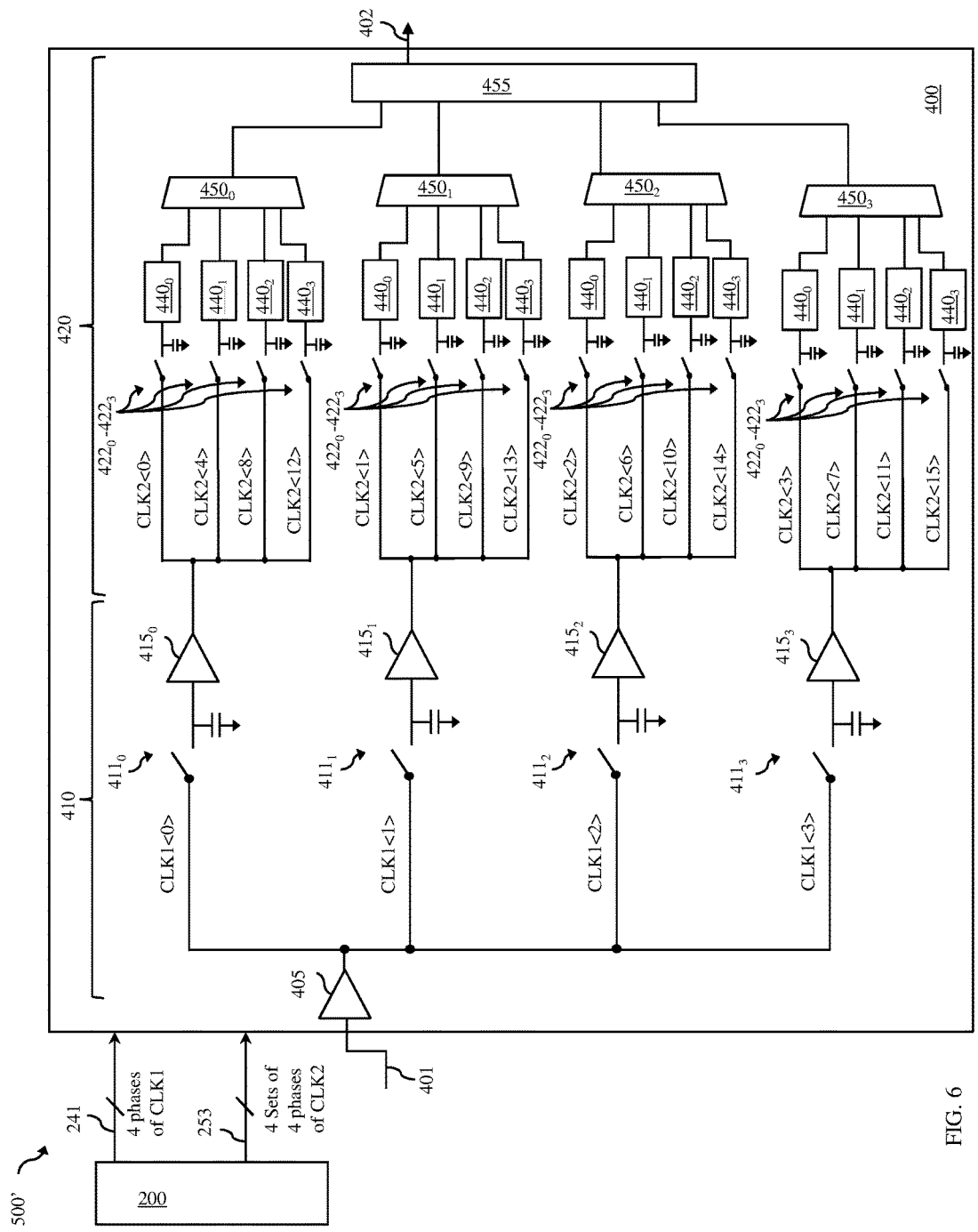
FIG. 6 shows a schematic diagram illustrating a specific embodiment of a time domain-interleaved ADC that incorporates the LFSR-based clock signal generator of FIG. 2.

As illustrated in the exemplary embodiment of the time domain-interleaved ADC 500' shown in FIG. 6, where N is equal to four (i.e., the total number of first circuit branches is equal to four), where M is also equal to four (i.e., the number of second circuit branches in each group is also equal to four) and where N*M is equal to sixteen (i.e., the total number of second circuit branches and, thereby the total number of sub-ADCs is sixteen), the LFSR-based clock signal generator 200 can generate a total of four instances 241 of the first clock signal (CLK1) and four sets 253 of four instances of the second clock signal for a total of sixteen instances of the second clock signal (CLK2). Of the four instances 241 of the first clock signal, CLK1<0> can be distributed to control timing of the first sample and hold switch $411_0$ and the sample and hold amplifier $415_0$ in the 1st first circuit branch; CLK1<1> can be distributed to control timing of the first sample and hold switch $411_1$ and the sample and hold amplifier $415_1$ in the next first circuit branch; CLK1<2> can be distributed to control timing of the first sample and hold switch $411_2$ and the sample and hold amplifier $415_2$ in the next first circuit branch; and CLK1<3> can be distributed to control timing of the first sample and hold switch $411_3$ and the sample and hold amplifier $415_3$ in the 4th first circuit branch. Additionally, of the sixteen instances of the second clock signal, CLK2<0>, CLK2<4>, CLK2<8> and CLK2<12> can be distributed so as to control timing of the second sample and hold switches $422_{0-3}$ and the sub-ADC $440_{0-3}$ in the second circuit branches within the group connected to the sample and hold amplifier $415_0$ of the first circuit branch clocked by CLK1<0>; CLK2<1>, CLK2<5>, CLK2<9>, and CLK2<13> can be distributed so as to control timing of the second sample and hold switches $422_{0-3}$ and the sub-ADCs $440_{0-3}$ in the second circuit branches within the group connected to the sample and hold amplifier $415_1$ of a first circuit branch clocked by CLK1<1>; CLK2<2>, CLK2<6>, CLK2<10> and CLK2<14> can be distributed so as to control timing of the second sample and hold switches $422_{0-3}$ and the sub-ADCs $440_{0-3}$ in the second circuit branches within the group connected to the sample and hold amplifier $415_2$ of a first circuit branch clocked by CLK1<2>; and CLK2<3>, CLK2<7>, CLK2<11> and CLK2<15> can be distributed so as to control timing of the second sample and hold switches $422_{0-3}$ and the sub-ADCs $440_{0-3}$ in the second circuit branches within the group connected to the sample and hold amplifier $415_3$ of the first circuit branch clocked by CLK1<3>.

It should be noted that in the on-chip time domain-interleaved ADCs 500 or 500' described above and illustrated in FIGS. 5A and 5B (or 6), respectively, the components of the LFSR-based clock signal generator 200 can optionally be distributed across the chip and, more particularly, in order to reduce routing complexity and area consumption, the single-phase pulse generator 230, the multi-phase pulse generators 240 and 250, and any additional delay elements 252 can be co-located on the chip with the circuit levels 410, 420 of the primary ADC 400 as opposed to being in relative large, centrally located clock generation block along with the LFSR 210. For example, taking a 4-phase system, after the 4-phase generator block the pulses are distributed one per quadrant (i.e., per group of sub-ADCs) along with their paired C4 system clock phase. This allows further pulses to be derived independently in each quadrant, meaning that each quadrant must receive only one phase of the system clock instead of all four. The first and second master timing pulses 233 and 234 are what enable this architecture. Generating the master timing pulses locally is preferred versus receiving a synchronization signal from logic because it allows the system to recover gracefully from an error. If the master timing pulses 233 and 234 were synchronized by a signal from logic, the derived phases would have to be constantly monitored to ensure the chain is operating in order, and issue a reset if not. Having a built-in state machine control the master timing pulses 233 and 234 allows the LFSR 210 to gracefully recover from a timing glitch without exterior intervention. The LFSR-based clock signal generator 200 enables this by providing a state machine that can operate at a clock rate of up to 15 GHz in a 7 nm CMOS process.

Additionally, it should be noted that the time domain-interleaved ADCs 500, 500' described above and illustrated in FIGS. 5A-5B and FIG. 6 are provided for illustration purposes and are not intended to be limiting. As mentioned above, it is anticipated that the above-described LFSR-based clock signal generator 200 employed on a chip to control timing of different circuits and/or different multi-level circuits, as appropriate.

Figure 7:
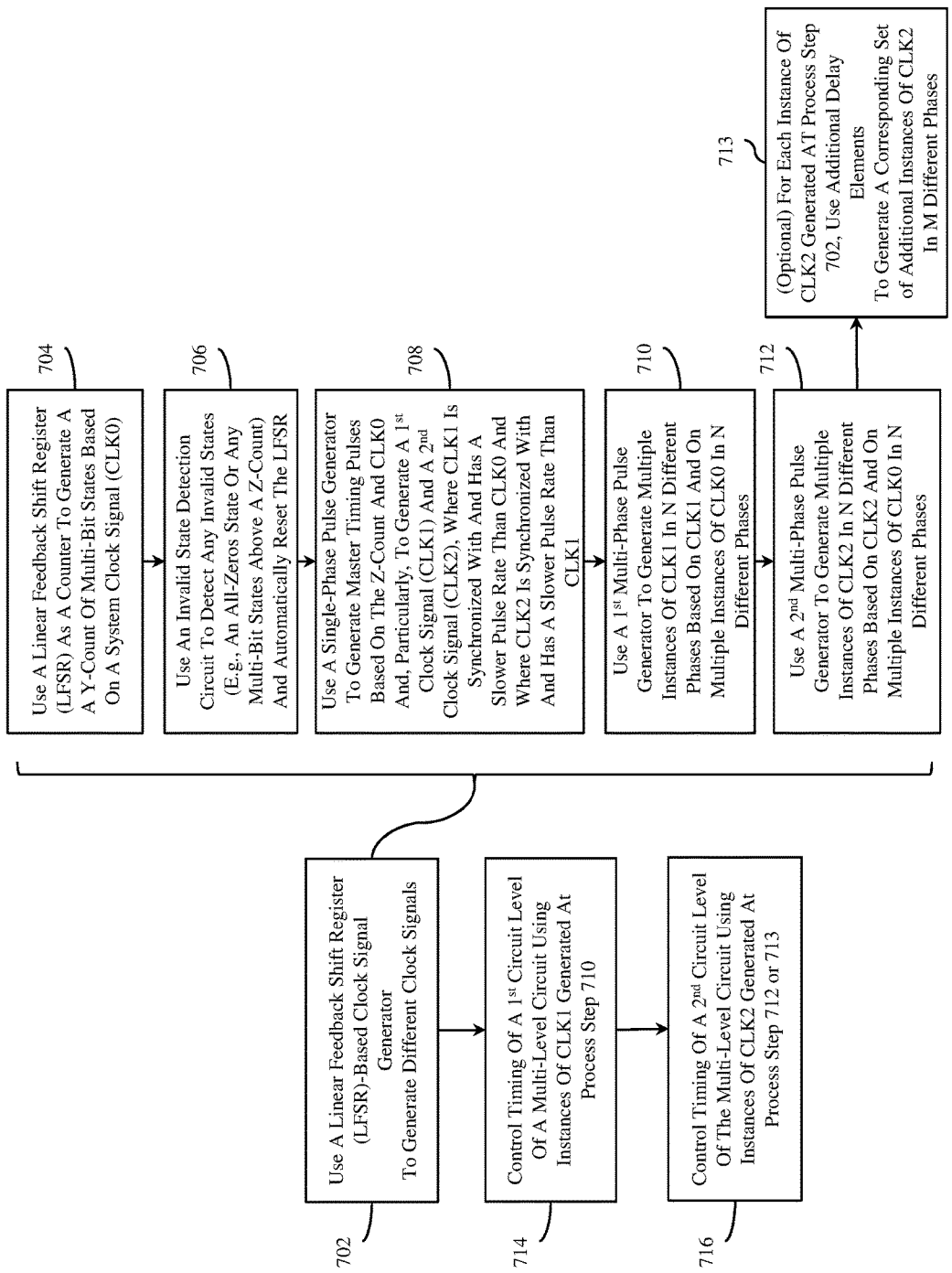
FIG. 7 is a flow diagram illustrating disclosed LFSR-based clock signal generation and time-interleaved analog to digital conversion methods associated with the disclosed circuit structures.

Referring to the flow diagram of FIG. 7, also disclosed herein are method embodiments associated with the above-described circuit structures. The method embodiments can include using a linear feedback shift register (LFSR)-based clock signal generator 200 (such as that described above and illustrated in FIG. 2) to generate single-phase first and second clock signals and, optionally, to further generate different, synchronized, multi-phase first and second clock signals based on those single-phase first and second clock signals (see process step 702). Specifically, these clock signals can include: a single-phase first clock signal 233 (CLK1 at 0°) and a single-phase second clock signal 234 (CLK1 at 0°). Furthermore, depending upon the circuit application, these clock signals can further include multiple instances 241 of a first clock signal (CLK1) in N different phases (N-phases of CLK1), multiple instances 251 of a second clock signal (CLK2) also in N different phases (N-phases of CLK2) and, optionally, for each instance 251 of the second clock signal (CLK2), a corresponding set 253 of additional instances of the second clock signal in M different phases (M-phases of CLK2). In any case, the first and second clock signals can be synchronized with the pulse rate of the first clock signal ($PR_{CLK1}$) being 1/N times the pulse rate of a system clock signal ($PR_{CLK0}$) and with the pulse rate of the second clock signal ($PR_{CLK2}$) being 1/N times the pulse rate of the first clock signal ($PR_{CLK1}$). It should be noted that, optionally, the pulse rate of the system clock signal ($PR_{CLK0}$) can be 1/N times the pulse rate of a master system clock signal ($PR_{MCLK}$).

The process steps for generating these signals can include receiving, by an LFSR 210, a single-phase system clock signal 203 (CLK0 at 0°) from a system clock signal generator (not shown) and, in response, outputting a series of multi-bit states (see process step 704). The LFSR 210, as discussed in detail above, can include a chain of a first number (X) of flip-flop $211_0$-$211_{X-1}$ with an XOR gate 213 inserted into the chain between the third and second to last flip-flops. Each multi-bit state output at process 704 can include the individual output bits from each of the flip-flops $211_0$-$211_{X-1}$ in the chain at corresponding taps $212_0$-$212_{X-1}$. Furthermore, as discussed in detail above, such an LFSR 210 can produce a predetermined number (Y) of multi-bit states, where the value of Y is determined by solving equation (1) above. In any case, by generating a series of multi-bit states, the LFSR 210 can effectively function as a counter with the clocked output of the multi-bit states functioning as a count from the counter (i.e., 1, 2, . . . Y).

The count output by the LFSR 210 can subsequently be used by a single-phase pulse generator 230 to generate single-phase first and second clock signals 233 and 234 (also referred to herein as master timing pulses 233 and 234) (see process step 708). However, to ensure that the count provided by the LFSR 210 to the single-phase pulse generator 230 will be suitable for producing the desired master timing pulses 233 and 234, an invalid state detection circuit 220, which is operably connected to the LFSR 210, can be used to detect when the LFSR 210 outputs any invalid states that would lead to an improper count and can cause the LFSR 210 to automatically reset the count (see process step 706). For example, an all-zeros state output by an LFSR 210, which is functioning as a counter, will be considered an invalid state because every shift of a zeroed LFSR will lead to a zero. Additionally, the LFSR 210 may be able to produce a total of Y multi-bit states (i.e., a Y-count), generation of the master timing pulses 233 and 234 by the single-phase pulse generator 230 of the LFSR-based clock signal generator 200 may require a different number (Z) of multi-bit states (i.e., a Z-count as opposed to a Y-count) and only that Z-count. In this case, all multi-bit states above the Z-count would also be considered invalid. Thus, the method embodiments can further include: detecting, by an invalid state detection circuit 220 that is operably connected to the LFSR 210, when the LFSR 210 has cycled through Z multi-bit states and also when an all-zeros state has been reached; and causing, by the invalid state detection circuit 220, the LFSR 210 to reset when either condition is detected (i.e., when the LFSR 210 has cycled through Z multi-bit states or when the LFSR 210 has reached the all-zeros state).

As a result, in the method embodiments only a series of Z valid multi-bit states (i.e., a Z-count) will be output by the LFSR 210 and received by the single-phase pulse generator 230 for use in generating the master timing pulses 233 and 234. The method embodiments can further include: receiving, by the single-phase pulse generator 230, of the Z valid multi-bit states; buffering, by pipeline registers 231 of the single-phase pulse generator 230, those multi-bit states; and further using, by combinational logic 232 of the single-phase pulse generator 230, the clocked receipt of the buffered Z multi-bit states to produce both a single-phase first clock signal 233 (CLK1 at 0°) (also referred to herein as a first master timing pulse) and a single-phase second clock signal 234 (CLK2 at 0°) (also referred to herein as a second master timing pulse), each with a desired sequence of pulses (see process step 708). The single-phase first clock signal 233 (CLK1 at 0°) can be synchronized with the single-phase system clock signal 203 (CLK0 at 0°) and can have a pulse rate ($PR_{CLK1}$) that is slower than and, particularly, 1/Nth (e.g., ¼th) the pulse rate ($PR_{CLK0}$) of the system clock signal 203. The single-phase second clock signal 234 (CLK2 at 0°) can be synchronized with the single-phase first clock signal 233 (CLK1 at 0°) and can have a pulse rate ($PR_{CLK2}$) that is slower than and, particularly, 1/Nth (e.g., ¼$^{th}$) the pulse rate of first clock signal 233 ($PR_{CLK1}$).

For example, as illustrated in FIG. 3, in one exemplary embodiment, the pulse rate of the system clock signal ($PR_{CLK0}$) can be ¼$^{th}$ the pulse rate of a master system clock signal ($PR_{MCLK}$). That is, the system clock signal 203 can be a quarter-rate clock signal (C4). Furthermore, N can be equal to four. Thus, in the master timing pulses generated at process step 708, the pulse rate ($PR_{CLK1}$) of the first clock signal 233 will be ¼$^{th}$ the pulse rate ($PR_{CLK0}$) of the system clock signal 203. That is, the first clock signal 233 can be a ¹⁄₁₆$^{th}$ rate clock signal. Additionally, the pulse rate ($PR_{CLK2}$) of the second clock signal 234 will be ¼$^{th}$ the pulse rate ($PR_{CLK1}$) of the first clock signal 233. That is, the second clock signal 234 can be a ¹⁄₆₄$^{th}$ rate clock signal. It should be noted that in this exemplary embodiment, where the system clock signal 203 is a quarter-rate clock signal (C4) and N is equal to four, the count received by the single-phase pulse generator 230 at process step 708 would need to be a 16-count in order to generate ¹⁄₁₆$^{th}$ rate-first clock signal 233 and a ¹⁄₆₄$^{th}$ rate-second clock signal 234. If Z=16, then equation (1) above dictates that the number of flip-flops $211_0$-$211_{X-1}$ in the chain of the LFSR 210 must be at least 5 (i.e., X≥5). Specifically, 4 flip-flops would be too few because 4 flip-flops could only result in a total number of 15 four-bit states (i.e., Y=$2^4$−1=16−1=15) or a 15-count. Five flip-flops would, however, result in too many multi-bit states and, more particularly, 31 five-bit states (i.e., Y=$2^5$−1=32−1=31) or a 31-count. Since only 16 multi-bit states (i.e., a 16-count) are required for generation of the first and second master timing pulses 233 and 234, all states above the 16-count as well as the all-zeros state will be considered invalid at process step 706.

It should also be noted that, as illustrated in FIG. 3, in addition to having different pulse rates the above-described first and second master timing pulses 233 and 234 can be generated at process step 708 so as to have different pulse widths. That is, the single-phase first clock signal 233 (i.e., the first master timing pulse) can have a pulse width ($PW_{CLK1}$) that is longer than the pulse width ($PW_{CLK0}$) of the single-phase system clock signal 203 and the single-phase second clock signal 234 (i.e., the second master timing pulse) can have a pulse rate ($PW_{CLK2}$) that is longer than the pulse width ($PR_{CLK1}$) of the single-phase first clock signal 233.

Embodiments of the method may include stopping clock signal generation with these two different single-phase clock signals (CLK1 at 0O and CLK2 at 0°) and, in this case, the two different single-phase clock signals can be used to control the timing of different on-chip circuits or different sections of the same on-chip circuit. Alternatively, embodiments of the method may include continuing with the generation of one or more additional instances of only one or both of these different clock signals in one or more different phases without synchronization and using the generated clock signals to control the timing of different on-chip circuits or different sections of the same on-chip circuit. Alternatively, as described in greater detail below and illustrated in the flow diagram, embodiments of the method can further include generating different, synchronized, multi-phase first and second clock signals based on the single-phase first and second clock signals output at process step 708 as well as a multi-phase system clock signal (see process steps 710-712).

More specifically, these method embodiments can including receiving, by a first multi-phase pulse generator 240, the single-phase first clock signal 233 and also some predetermined number (N) of instances 204 of the clock signal in N different phases, respectively (N-phases of CLK0) (e.g., from a system clock signal generator (not shown)) and, in response, generating and outputting, by the the first multi-phase pulse generator 240, N instances 241 of the first clock signal in N different phases, respectively (N-phases of CLK1, also referred to as CLK1<N−1:0>) including CLK1<0>, CLK1<1>, and so on until CLK1<N−1>, as shown in FIG. 4A (see process step 710).

Additionally, these method embodiments can include receiving, by a second multi-phase pulse generator 250, the single-phase second clock signal 234 and also the N instances 204 of the system clock signal in N different phases (N-phases of CLK0) (e.g., again from the system clock signal generator (not shown)) and, in response, generating and outputting, by the second multi-phase pulse generator 250, N instances 251 of the second clock signal in N different phases, respectively (N-phases of CLK2, also referred to as CLK2<N−1:0) including CLK1<0>, CLK12<1>, and so on until CLK2<N−1>, as shown in FIG. 4B.

These method embodiments can further include using the multiple instances 241 of the first clock signal (CLK1) output at process step 710 and the multiple instances 251 of the second clock signal (CLK2) output at process 712 to control different on-chip circuits, respectively, or different levels, respectively, of the same on-chip circuit (see process steps 714 and 716). Typically, however, different on-chip circuits or different levels of the same on-chip circuit that use different clock signals will not require the same number of different phases of those clock signals.

Thus, generation of the clock signals at process step 702 can further include using additional delay elements 252 (e.g., additional registers) to delay each one of the instances 251 of the second clock signal generated at process step 712 as necessary in order to further generate N corresponding sets 253, respectively, of additional instances of the second clock signal in some predetermined number (M) of different phases (i.e., CLK2<N*(M−1)+N−1:0>) (see process step 713). That is, for each instance 251 of the second clock signal generated by the second multi-phase pulse generator 250 at process step 712, additional delay elements 252 can be used at process 713 to generate a different set 253 of additional instances of the second clock signal (CLK2) in M different phases. As illustrated in FIG. 4C, the different sets 253 will include: Set$_0$ with CLK2<0>, CLK2<N>, ... and CLK2<N*(M−1)>; Set$_1$ with CLK2<1>, CLK2<N+1>, ... and CLK2<N*(M−1)+1>; ... and Set$_{N-1}$ with CLK2<N−1>, CLK2<N+N−1>, ... and CLK2<N*(M−1)+N−1>. Consequently, if M is the total number of instances of the second clock signal to be generated for each of the N sets, then N*M will be the total number of different instances of the second clock signal to be generated and output by the LFSR-based clock signal generator 200.

In this case, the method embodiments can further include using the clock signals generated and output by the LFSR-based clock signal generator 200 at process steps 710 and 712 to control timing of different on-chip circuits or, alternatively, to control timing of different circuit levels within an on-chip multi-level circuit (see process steps 714 and 716). For example, the different, synchronized, multi-phase first and second clock signals generated and output at process steps 710 and 713 can be used at process steps 714-716 to control timing of a first circuit level 410 and a second circuit level 420, respectively, of a time domain-interleaved ADC 500 (as illustrated in FIGS. 5A-5B and discussed in detail above) or 500' (as illustrated in FIG. 6 and discussed in detail above). That is, the N instances 241 of the first clock signal (CLK1) in the N different phases can be distributed in a time domain-interleaved ADC 500, 500' at process step 714 so as to control N different first circuit branches in the first circuit level 410 of the primary ADC 400 of the time domain-interleaved ADC 500, 500' (see process step 714). Additionally, the N sets 253 of additional instances of the second clock signal (CLK2) in M different phases (CLK2<N*(M−1)+N−1:0>)) can be distributed so as to control the M different second circuit branches in each group of second circuit branches in the second circuit level 420 of the primary ADC 400 of the time domain-interleaved ADC 500 or 500' (see process step 716).

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A clock signal generator comprising:
a linear feedback shift register comprising multiple flip-flops connected in a chain, wherein the linear feedback shift register receives a system clock signal and, based on the clock signal, outputs a series of multi-bit states and wherein each multi-bit state comprises individual output bits from each of the flip-flops; and
a single-phase pulse generator receiving the series of multi-bit states and generating a first clock signal and a second clock signal, wherein a pulse rate of the first clock signal is slower than a pulse rate of the system clock signal and a pulse rate of the second clock signal is slower than a pulse rate of the first clock signal and wherein the single-phase pulse generator uses receipt of the series of multi-bit states as a counter during generation of the first clock signal and the second clock signal.

2. The clock signal generator of claim 1, wherein a pulse width of the first clock signal is longer than a pulse width of the system clock signal and a pulse width of the second clock signal is longer than a pulse width of the first clock signal.

3. The clock signal generator of claim 1, wherein the single-phase pulse generator comprises pipeline registers that buffer the multi-bit states and combinational logic that produces the first clock signal and the second clock signal based on the buffered multi-bit states.

4. The clock signal generator of claim 1, further comprising:
a first multi-phase pulse generator receiving the first clock signal and multiple instances of the system clock signal in different phases and generating multiple instances of the first clock signal in different phases; and
a second multi-phase pulse generator receiving the second clock signal and the multiple instances of the system clock signal in different phases and generating multiple instances of the second clock signal in different phases,
wherein the multiple instances of the system clock signal, the multiple instances of the first clock signal, and the multiple instances of the second clock signal are all in a number (N) of different phases.

5. The clock signal generator of claim 4, further comprising additional delay elements that delay each instance of the second clock signal to further generate, for each instance of the second clock signal in each one of the number (N) of different phases, a corresponding set of additional instances of the second clock signal in a number (M) of different phases.

6. The clock signal generator of claim 1, further comprising an invalid state detection circuit operably connected to the linear feedback shift register,
wherein the linear feedback shift register comprises a first number (X) of the flip-flops and is capable of producing a second number (Y) of the multi-bit states that is equal to $2^X-1$,
wherein the single-phase pulse generator requires only a third number (Z) of the multi-bit states to produce the first clock signal and the second clock signal,
wherein the invalid state detection circuit detects when the linear feedback shift register has cycled through Z multi-bit states and when the linear feedback shift register reaches an all-zeros state, and
wherein the invalid state detection circuit causes the linear feedback shift register to reset when either the linear feedback shift register has cycled through Z multi-bit states or when the linear feedback shift register has reached the all-zeros state.

7. The clock signal generator of claim 1, wherein the system clock signal is a one quarter rate clock signal, the first clock signal is a one sixteenth rate clock signal, and the second clock signal is a one sixty-fourth rate clock signal.

8. A time domain-interleaved analog-to-digital converter (ADC) comprising:

first circuit branches, each comprising:
  a first sample and hold amplifier; and
  a first sample and hold switch that selectively connects the first sample and hold amplifier to an input node;
multiplexers;
groups of second circuit branches connected between the first circuit branches and the multiplexers, respectively, each second circuit branch in each group comprising:
  a sub-ADC connected to a corresponding one of the multiplexers; and
  a second sample and hold switch that selectively connects the sub-ADC to the first sample and hold amplifier of a corresponding one of the first circuit branches;
a digital signal processor that receives intermediate digital output signals from the multiplexers, respectively, and outputs a final digital output signal at an output node; and
a clock signal generator comprising:
  a linear feedback shift register receiving a system clock signal and outputting a series of multi-bit states based on the system clock signal;
  a single-phase pulse generator receiving the multi-bit states and generating a first clock signal and a second clock signal, wherein a pulse rate of the first clock signal is slower than a pulse rate of the system clock signal and a pulse rate of the second clock signal is slower than a pulse rate of the first clock signal;
  a first multi-phase pulse generator receiving the first clock signal and multiple instances of the system clock signal in different phases and generating multiple instances of the first clock signal in different phases to control timing of the first circuit branches; and
  a second multi-phase pulse generator receiving the second clock signal and the multiple instances of the system clock signal in different phases and generating multiple instances of the second clock signal in different phases for each instance of the first clock signal to control timing of the second circuit branches.

9. The time domain-interleaved ADC of claim 8, wherein a pulse width of the first clock signal is longer than a pulse width of the system clock signal and a pulse width of the second clock signal is longer than a pulse width of the first clock signal.

10. The time domain-interleaved ADC of claim 8, wherein the single-phase pulse generator comprises pipeline registers that buffer the multi-bit states and combinational logic that produces the first clock signal and the second clock signal based on the buffered multi-bit states.

11. The time domain-interleaved ADC of claim 8, wherein the multiple instances of the system clock signal, the multiple instances of the first clock signal, and the multiple instances of the second clock signal are all in a same number (N) of different phases.

12. The clock signal generator of claim 11, further comprising additional delay elements that delay each instance of the second clock signal to further generate, for each instance, additional instances of the second clock signal in another number (M) of different phases.

13. The time domain-interleaved ADC of claim 8, wherein the clock signal generator further comprises invalid state detection circuit operably connected to the linear feedback shift register, wherein the linear feedback shift register comprises a first number (X) of flip-flops and is capable of producing a second number (Y) of multi-bit states that is equal to $2^X-1$,
wherein the single-phase pulse generator requires only a third number (Z) of the multi-bit states to produce the first clock signal and the second clock signal,
wherein the invalid state detection circuit detects when the linear feedback shift register has cycled through Z multi-bit states and when the linear feedback shift register reaches an all-zeros state, and
wherein the invalid state detection circuit causes the linear feedback shift register to reset when either the linear feedback shift register has cycled through Z multi-bit states or when the linear feedback shift register has reached an all-zeros state.

14. The time domain-interleaved ADC of claim 13,
wherein the clock signal generator further comprises an invalid state detection circuit operably connected to the linear feedback shift register,
wherein the linear feedback shift register comprises five flip-flops and is capable of producing thirty-one five-bit states,
wherein the single-phase pulse generator requires only sixteen five-bit states to produce the first clock signal and the second clock signal,
wherein the invalid state detection circuit detects when the linear feedback shift register has cycled through sixteen five-bit states and when the linear feedback shift register reaches a five-zeros state, and
wherein, when the linear feedback shift register has cycled through sixteen five-bit states or when the linear feedback shift register has reached a five-zeros state, the invalid state detection circuit causes the linear feedback shift register to reset.

15. A method comprising:
receiving, by a linear feedback shift register, a system clock signal;
outputting, by the linear feedback shift register, a series of multi-bit states based on the system clock signal;
receiving, by a single-phase pulse generator, the series of multi-bit states;
generating, by the single-phase pulse generator based on the series of multi-bit states, a first clock signal and a second clock signal, wherein a pulse rate of the first clock signal is slower than a pulse rate of the system clock signal and a pulse rate of the second clock signal is slower than a pulse rate of the first clock signal;
receiving, by a first multi-phase pulse generator, the first clock signal and multiple instances of the system clock signal in different phases;
generating, by the first multi-phase pulse generator, multiple instances of the first clock signal in different phases; and
receiving, by a second multi-phase pulse generator, the second clock signal and the multiple instances of the system clock signal in different phases; and
generating, by the second multi-phase pulse generator, multiple instances of the second clock signal in different phases for each instance of the first clock signal,
wherein the multiple instances of the system clock signal, the multiple instances of the first clock signal, and the multiple instances of the second clock signal are all in a number (N) of different phases.

16. The method of claim 15, wherein a pulse width of the first clock signal is longer than a pulse width of the system clock signal and a pulse width of the second clock signal is longer than a pulse width of the first clock signal.

17. The method of claim 15, further comprising using additional delay elements that delay each instance of the second clock signal to further generate, for each instance, a set of additional instances of the second clock signal in a number (M) of different phases.

18. The method of claim 17, further comprising:
controlling timing of first circuit branches of a time domain interleaved analog-to-digital converter (ADC) using the multiple instances of the first clock signal in the number (N) of different phases; and
controlling timing of each group of second circuit branches of the time domain interleaved ADC using the multiple instances of the second clock signal in the number (N) of different phases and further using the additional instances of the second clock signal in the number (M) of different phases.

19. The method of claim 15,
wherein the linear feedback shift register comprises a first number (X) of flip-flops and is capable of producing a second number (Y) of the multi-bit states that is equal to $2^X-1$,
wherein the single-phase pulse generator requires only a third number (Z) of the multi-bit states to produce the first clock signal and the second clock signal, and
wherein the method further comprises:
detecting, by an invalid state detection circuit operably connected to the linear feedback shift register, when the linear feedback shift register has cycled through Z multi-bit states and when the linear feedback shift register reaches an all-zeros state; and
causing, by the invalid state detection circuit, the linear feedback shift register to reset when either the linear feedback shift register has cycled through Z multi-bit states or when the linear feedback shift register has reached an all-zeros state.

* * * * *